United States Patent
Hirabayashi

(10) Patent No.: US 6,744,198 B2
(45) Date of Patent: Jun. 1, 2004

(54) METHOD FOR MANUFACTURING DISPLAY DEVICE, DISPLAY DEVICE, AND ELECTRONIC APPARATUS

(75) Inventor: Yukiya Hirabayashi, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 123 days.

(21) Appl. No.: 10/100,043

(22) Filed: Mar. 19, 2002

(65) Prior Publication Data
US 2002/0140343 A1 Oct. 3, 2002

(30) Foreign Application Priority Data
Mar. 19, 2001 (JP) ........................... 2001-078900

(51) Int. Cl.[7] ............... H05B 33/00; G02F 1/133; H09J 9/24
(52) U.S. Cl. ............... 313/506; 313/505; 313/590; 345/58; 257/83; 445/24; 438/20
(58) Field of Search ............... 313/506, 499, 313/500, 495, 497, 505, 584, 585, 586, 587, 590, 313, 352, 306; 428/917; 257/10, 27, 83, 84; 345/43, 58, 76; 445/24; 438/20

(56) References Cited

U.S. PATENT DOCUMENTS

| 5,294,869 A | * | 3/1994 | Tang et al. ............... 313/504 |
| 6,072,450 A | * | 6/2000 | Yamada et al. ............... 345/76 |
| 6,366,025 B1 | * | 4/2002 | Yamada ............... 315/169.3 |

* cited by examiner

Primary Examiner—Ashok Patel
(74) Attorney, Agent, or Firm—Oliff & Berridge, PLC

(57) ABSTRACT

The invention provides a method for manufacturing a display device that includes a light-transmitting substrate and, above the light-transmitting substrate, a plurality of light-emitting elements arrayed in a plane, driving elements connected to the light-emitting elements, a bank layer disposed in the boundary areas between the plurality of light-emitting elements, and wires connected to the driving elements. In this method, the wires are formed by patterning a light-shielding, conductive layer on the light-transmitting substrate so as to have a shape in plan view corresponding to the shape of the bank layer in plan view. Then, the wires, acting as a mask, are exposed from the rear surface of the substrate to form the bank layer by self-aligning above the wires. Then, the light-emitting elements are formed in the areas surrounded by the bank layer.

19 Claims, 7 Drawing Sheets

METHOD FOR MANUFACTURING DISPLAY DEVICE, DISPLAY DEVICE, AND ELECTRONIC APPARATUS

BACKGROUND OF THE INVENTION

1. Field of the Invention

The present invention relates to methods for manufacturing display devices that include light-emitting elements, such as electroluminescent (hereinafter referred to as EL) elements and LED (light emitting diode) elements, and to display devices manufactured in accordance with these methods.

2. Description of Related Art

In active matrix displays using current-controlled light-emitting elements, such as organic EL elements and LED elements, such light-emitting elements emit light by themselves. Therefore, unlike liquid crystal displays, these active matrix displays do not need any backlight, and provide advantages including visibility that is less dependent upon angle.

In these display devices, generally, a plurality of light-emitting elements are arrayed in a matrix. Adjacent light-emitting elements are separated by an insulative, light-shielding protrusion referred to as a bank layer.

In order to form the display devices, a liquid material for forming a hole injection layer, and a liquid material for forming an organic EL layer or an organic semiconductive layer, are discharged, by, for example, an ink-jet method, into compartments separated by bank layers, that is, into pixels, to deposit a hole injection layer and an organic EL layer or an organic semiconductive layer in the compartments. This protruding bank layer prevents the precursors for these layers from extending into adjacent compartments when the precursors are discharged.

In addition, this light-shielding bank layer prevents light from passing through gaps between pixels, and colors from being mixed with each other between the adjacent pixels, and thus increases the contrast ratio when a completed display device is operated.

On the other hand, boundary areas between the light-emitting elements have driving elements, such as thin-film transistors (hereinafter referred to as TFT), for driving the light-emitting elements and various wires connected to the driving elements. The wires are formed of, for example, aluminum or the like. In addition, these boundary areas are provided with a light-shielding layer for preventing the TFTs from generating an optical leakage current.

SUMMARY OF THE INVENTION

The present invention is directed to a method for manufacturing a display device that includes a light-transmitting substrate and, above the light-transmitting substrate, a plurality of light-emitting elements arrayed in a plane, driving elements connected to the light-emitting elements, a bank layer disposed in the boundary areas between the plurality of light-emitting elements, and wires connected to the driving elements. The method includes the steps of: forming the wires on the light-transmitting substrate by patterning a light-shielding, conductive layer so as to have a shape in plan view corresponding to the shape of the bank layer in plan view; forming the bank layer by self-aligning above the wires on the substrate by exposing the wires, acting as a mask, from the rear surface of the substrate; and forming the light-emitting elements in the areas surrounded by the bank layer.

The present invention is also directed to a method for manufacturing a display device that includes a light-transmitting substrate and, above the light-transmitting substrate, a plurality of light-emitting elements arrayed in a plane, driving elements connected to the light-emitting elements, a bank layer disposed in the boundary areas between the plurality of light-emitting elements, and a light-shielding layer to shield at least part of the driving elements from light. The method includes the steps of: forming the light-shielding layer on the light-transmitting substrate by patterning a shape in plan view corresponding to the shape of the bank layer in plan view; forming the bank layer by self-aligning above the light-shielding layer on the substrate by exposing the light-shielding layer, acting as a mask, from the rear surface of the substrate; and forming the light-emitting elements in the areas surrounded by the bank layer.

A display device according to the present invention includes, above a light-transmitting substrate, a plurality of light-emitting elements arrayed in a plane, driving elements, each being connected to the corresponding light-emitting element, a bank layer disposed in the boundary areas between the plurality of light-emitting elements, and wires formed of a light-shielding, conductive film connected to the driving elements. The wires above the substrate act as a mask while being subjected to light exposure from the rear surface of the substrate to form the bank layer above the wires by self-aligning.

A display device according to the present invention includes, above a light-transmitting substrate, a plurality of light-emitting elements arrayed in a plane, driving elements, each being connected to the corresponding light-emitting element, a bank layer disposed in the boundary areas between the plurality of light-emitting elements, and wires formed of a light-shielding, conductive film connected to the driving elements. At least part of the wires has a shape in plan view corresponding to the shape of the bank layer in plan view.

A display device according to the present invention includes, above a light-transmitting substrate, a plurality of light-emitting elements arrayed in a plane, driving elements, each being connected to the corresponding light-emitting element, a bank layer disposed in the boundary areas between the plurality of light-emitting elements, and a light-shielding layer to shield at least part of the driving elements from light. The light-shielding layer above the substrate acts as a mask while being subjected to light exposure from the rear surface of the substrate to form the bank layer above the light-shielding layer by self-aligning.

A display device according to the present invention includes, above a light-transmitting substrate, a plurality of light-emitting elements arrayed in a plane, driving elements, each being connected to the corresponding light-emitting element, a bank layer disposed in the boundary areas between the plurality of light-emitting elements, and a light-shielding layer to shield at least part of the driving elements from light. The light-shielding layer has a shape in plan view corresponding to the shape of the bank layer in plan view.

An electronic apparatus according to the present invention includes a display device described above.

Cost reduction in manufacturing and enhancement of image quality, which are typical requirements for display devices, are strongly desired in the display devices discussed above, as well as in other display devices.

In the related art manufacturing method discussed above, unfortunately, a dedicated photomask must be used to form a bank layer. The manufacturing cost, therefore, increases due to the formation of the bank layer.

In addition, using the dedicated photomask to form the bank layer of the display devices in the related art method reduces and varies the aperture ratio in pixels according to the alignment accuracy between the various light-shielding wires or the driving elements and the bank layer, which consequently makes it difficult to display bright and high-quality images.

Considering the above-described problems, the present invention provides a method for manufacturing a display device in which the manufacturing cost is reduced, and which ensures a high aperture ratio and a reduced variation of aperture ratios in pixels. The invention also provides a display device that is capable of displaying bright and high-quality images.

A first method for manufacturing a display device according to an embodiment of the present invention is a method for manufacturing a display device that includes a light-transmitting substrate and, above the light-transmitting substrate, a plurality of light-emitting elements arrayed in a plane, driving elements connected to the light-emitting elements, a bank layer disposed in the boundary areas between the plurality of light-emitting elements, and wires connected to the driving elements. The method includes the steps of: forming the wires on the light-transmitting substrate by patterning a light-shielding, conductive layer so as to have a shape in plan view according to the shape of the bank layer in plan view; forming the bank layer by self-aligning above the wires on the substrate by exposing the wires, acting as a mask, from the rear surface of the substrate; and forming the light-emitting elements in the areas surrounded by the bank layer.

According to the first method for manufacturing the display device, the wires are formed by patterning a light-shielding, conductive layer on the light-transmitting substrate so as to have a shape in plan view corresponding to the shape of the bank layer in plan view, in the step of forming the wires. Then, in the step of forming the bank layer, the light-shielding wires act as a mask while being exposed from the rear surface of the substrate to form the bank layer above the wires by self-aligning. Specifically, for example, a black resist is subjected to lithography and etching using the wires, acting as a mask, to form the bank layer by self-aligning. Therefore, no dedicated photomask is necessary to form the bank layer. Then, in the step of forming the light-emitting elements, the light-emitting elements are formed in the areas surrounded by the bank layer. The light-emitting elements, therefore, do not extend beyond the areas surrounded by the bank layer. Also, the wires and the bank layer of the completed display device can have substantially the same shape in plan view, and therefore, the aperture ratio in pixels is hardly reduced due to the alignment accuracy between the wires and the bank layer, as in the related art discussed above, and the variation of the aperture ratio in pixels is reduced. As a result, an active matrix-driving display device that is capable of displaying bright and high-quality images can be manufactured at a relatively low cost.

Exemplary light-emitting elements according to the present invention include organic EL elements and LEDs that include an organic EL layer or an organic semiconductive layer.

In order to prevent the light-emitting elements from overflowing, preferably, the bank layer can have a thickness of, for example, 1 μm or more, and a thickness larger than that of the light-emitting elements, or the bank layer can be formed of a water-repellent material. Light-emitting elements formed on the areas where the driving elements have already been formed are not involved in displaying images and increase unwanted current. Instead of forming the light-emitting elements, therefore, forming the bank layer on the areas where the driving elements have been formed is advantageous.

In an embodiment of the first method for manufacturing the display device, the step of forming the driving elements in the boundary areas may further be performed between the steps of forming the wires and forming the bank layer.

According to this method, a display device that has driving elements, such as TFTs, deposited between the wires and the bank layer can be manufactured at a relatively low cost.

A second method for manufacturing a display device according to the present invention is a method for manufacturing a display device that includes a light-transmitting substrate and, above the light-transmitting substrate, a plurality of light-emitting elements arrayed in a plane, driving elements connected to the light-emitting elements, a bank layer disposed in the boundary areas between the plurality of light-emitting elements, and a light-shielding layer to shield at least part of the driving elements from light. The method includes the steps of: forming the light-shielding layer on the light-transmitting substrate by patterning a shape in plan view corresponding to the shape of the bank layer in plan view; forming the bank layer by self-aligning above the light-shielding layer on the substrate by exposing the light-shielding layer, acting as a mask, from the rear surface of the substrate; and forming the light-emitting elements in the areas surrounded by the bank layer.

According to the second method for manufacturing the display device, the light-shielding layer is formed by patterning a shape in plan view corresponding to the shape of the bank layer in plan view on the light-transmitting substrate, in the step of forming the light-shielding layer. Then, in the step of forming the bank layer, the light-shielding layer after patterning acts as a mask, while being exposed from the rear surface of the substrate to form the bank layer above the light-shielding layer by self-aligning. Specifically, for example, a black resist is subjected to lithography and etching using the light-shielding layer as a mask to form the bank layer by self-aligning. Therefore, no dedicated photomask is necessary to form the bank layer. Then, in the step of forming the light-emitting element layers, the light-emitting elements are formed in the areas surrounded by the bank layer. The light-emitting elements, therefore, do not extend beyond the areas surrounded by the bank layer. Also, the light-shielding layer and the bank layer of the completed display device can have substantially the same shape in plan view, and therefore, the aperture ratio in pixels is hardly reduced due to the alignment accuracy between the fight-shielding layer and the bank layer, as in the related art discussed above, and the variation of the aperture ratio in pixels is reduced. As a result, an active matrix-driving display device that is capable of displaying bright and high-quality images can be manufactured at a relatively low cost.

In an embodiment of the second method for manufacturing the display device, the step of forming the driving elements in the boundary areas may further be performed between the steps of forming the light-shielding layer and forming the bank layer.

According to this method, a display device that has elements, such as TFTs, deposited between the light-shielding layer and the bank layer, is manufactured at a relatively low cost.

In another embodiment of the second method for manufacturing the display device, the driving elements may include thin-film transistors. The light-shielding layer is patterned so as to cover at least channel regions of the thin-film transistors at the light-transmitting substrate side of the thin-film transistors in the step of forming the light-shielding layer.

According to this method, the display device has a structure in which the channel regions of the thin-film transistors are covered with the light-shielding layer from the upper side or the under side of the thin-film transistors, and the occurrence of optical leakage current in the thin-film transistors is reduced. Thus, a display device, in which the thin-film transistors having such excellent characteristics drive the light-emitting elements, can be manufactured at relatively low cost.

In another embodiment of the second method for manufacturing the display device, a conductive light-shielding layer serving as wires may be formed in the step of forming the light-shielding layer.

According to this method, a display device is provided which can relatively easily be manufactured, which has a light-shielding layer serving as wires in addition to its primary function, and which has a simple layered structure. For example, the light-shielding layer serving as wires set at a constant potential stabilizes the potential in the vicinity of the driving elements, and thus, the operation of the driving elements can be enhanced.

In another embodiment of the first or the second method for manufacturing the display device, the step of forming the light-emitting elements may include a sub step of using an ink-jet method to form at least part of the light-emitting elements.

By discharging, for example, a precursor which is a liquid material to form a hole injection layer, and further another precursor which is a liquid material to form an organic EL layer or an organic semiconductive layer, into compartments separated by the bank layer, by the ink-jet method, that is, into pixels, the hole injection layer and the organic EL layer or the organic semiconductive layer can be disposed in the compartments.

In another embodiment of the first or the second method for manufacturing the display device, the step of forming the light-emitting elements may include a sub step of forming an organic EL layer or an organic semiconductive layer.

According to this method, the display device having organic EL elements or LEDs can relatively easily be manufactured, while the bank layer is preventing the organic EL layer or the organic semiconductive layer from extending into the adjacent compartments.

A first display device according to the present invention includes, above a light-transmitting substrate, a plurality of light-emitting elements arrayed in a plane, driving elements, each being connected to the corresponding light-emitting element, a bank layer disposed in the boundary areas between the plurality of light-emitting elements, and wires formed of a light-shielding, conductive film connected to the driving elements. The wires above the substrate act as a mask, while being subjected to light exposure from the rear surface of the substrate to form the bank layer above the wires by self-aligning.

According to the first display device, the wires and the bank layer have substantially the same shape in plan view, and therefore, the aperture ratio in pixels is hardly reduced due to the alignment accuracy between the wires and the bank layer, as in the related art discussed above, and the variation of the aperture ratio in pixels is reduced. As a result, bright and high-quality images can be displayed.

A second display device according to the present invention includes, above a light-transmitting substrate, a plurality of light-emitting elements arrayed in a plane, driving elements, each being connected to the corresponding light-emitting element, a bank layer disposed in the boundary areas between the plurality of light-emitting elements, and wires formed of a light-shielding, conductive film connected to the driving elements. At least part of the wires has a shape in plan view corresponding to the shape of the bank layer in plan view.

In an embodiment of the first or the second display device, the wires may include at least one of data lines, scanning lines, capacitor lines, and common power lines.

According to this structure, the data lines, the scanning lines, the capacitor lines, or the common power lines make it possible to perform relatively complicated active matrix-driving. Also, providing a bank layer having substantially the same shape as the data lines, the scanning lines, the capacitor lines, or the common power lines in plan view makes it possible to display bright and high-quality images.

A third display device according to the present invention includes, above a light-transmitting substrate, a plurality of light-emitting elements arrayed in a plane, driving elements, each being connected to the corresponding light-emitting element, a bank layer disposed in the boundary areas between the plurality of light-emitting elements, and a light-shielding layer to shield at least part of the driving elements from light. The light-shielding layer above the substrate acts as a mask, while being subjected to light exposure from the rear surface of the substrate to form the bank layer above the light-shielding layer by self-aligning.

According to the third display device, the light-shielding layer and the bank layer have substantially the same shape in plan view, and therefore the aperture ratio in pixels is hardly reduced due to the alignment accuracy between the light-shielding layer and the bank layer, as in the related art discussed above, and the variation of the aperture ratio in pixels is reduced. As a result, bright and high-quality images can be displayed.

A fourth display device according to the present invention includes, above a light-transmitting substrate, a plurality of light-emitting elements arrayed in a plane, driving elements, each being connected to the corresponding light-emitting element, a bank layer disposed in the boundary areas between the plurality of light-emitting elements, and a light-shielding layer to shield at least part of the driving elements from light. The light-shielding layer has a shape in plan view corresponding to the shape of the bank layer in plan view.

In an embodiment of the third or the fourth display device, the driving elements may include thin-film transistors. The light-shielding layer is patterned so as to cover at least channel regions of the thin-film transistors at the underside of the thin-film transistors.

According to this structure, at least the channel regions of the thin-film transistors are covered with the light-shielding layer from the underside of the thin-film transistors on the substrate, and thus, the occurrence of optical leakage current in the thin-film transistors is reduced. The light-emitting elements, therefore, can be driven by thin-film transistors having such excellent characteristics. As a result, high-quality images can be displayed.

In another embodiment of the third or the fourth display device, the driving elements may include thin-film transistors. The light-shielding layer is patterned so as to cover at least channel regions of the thin-film transistors at the upper side of the thin-film transistors.

According to this structure, at least the channel regions of the thin-film transistors are covered with the light-shielding layer at the upper side of the thin-film transistors on the substrate, and thus the occurrence of optical leakage current in the thin-film transistors is reduced. The light-emitting elements, therefore, can be driven by thin-film transistors having such excellent characteristics. As a result, higher-quality images can be displayed.

The light-shielding layer may be disposed at both upper and under sides of the thin-film transistors.

In another embodiment of any one of the first to fourth display devices, the light-emitting elements may include an organic EL layer or an organic semiconductive layer.

According to this structure, the bank layer prevents the organic EL layer or the organic semiconductive layer from extending into the adjacent compartments, and therefore the display device can display high-quality images using the reliable organic EL elements or LEDs.

In another embodiment of any one of the first to fourth display devices, the driving elements may include a plurality of thin-film transistors for each light-emitting element.

According to this structure, by combining, for example, two thin-film transistors, current-controlled light-emitting elements, such as organic EL elements, in pixels can be controlled.

Another embodiment of any one of the first to fourth display devices may further include a peripheral circuit connected to the driving elements or the wires in the peripheral region on the substrate. Part of the wire of the peripheral circuit is formed with the same layer as the wires or the light-shielding layer.

Thus, a so-called peripheral circuit-containing display device can be achieved which contains a peripheral circuit, such as a scanning line driving circuit and a data line driving circuit, having wires formed with the same layer as the wires or the light-shielding layer in the image-displaying section.

An apparatus according to the embodiment of the present invention includes any one of the first to the fourth display devices.

The above-described effects and other advantages of the present invention will become clear from the following description of the embodiments.

DETAILED DESCRIPTION OF PREFERRED EMBODIMENTS

The embodiments of the present invention will now be described with reference to the drawings. In the following embodiment, the display device of the present invention is applied to an active matrix-driving display device including charge injection-type organic thin-film EL elements, which are current-controlled light-emitting elements.

Overall Structure of the Display Device

Figure 1:
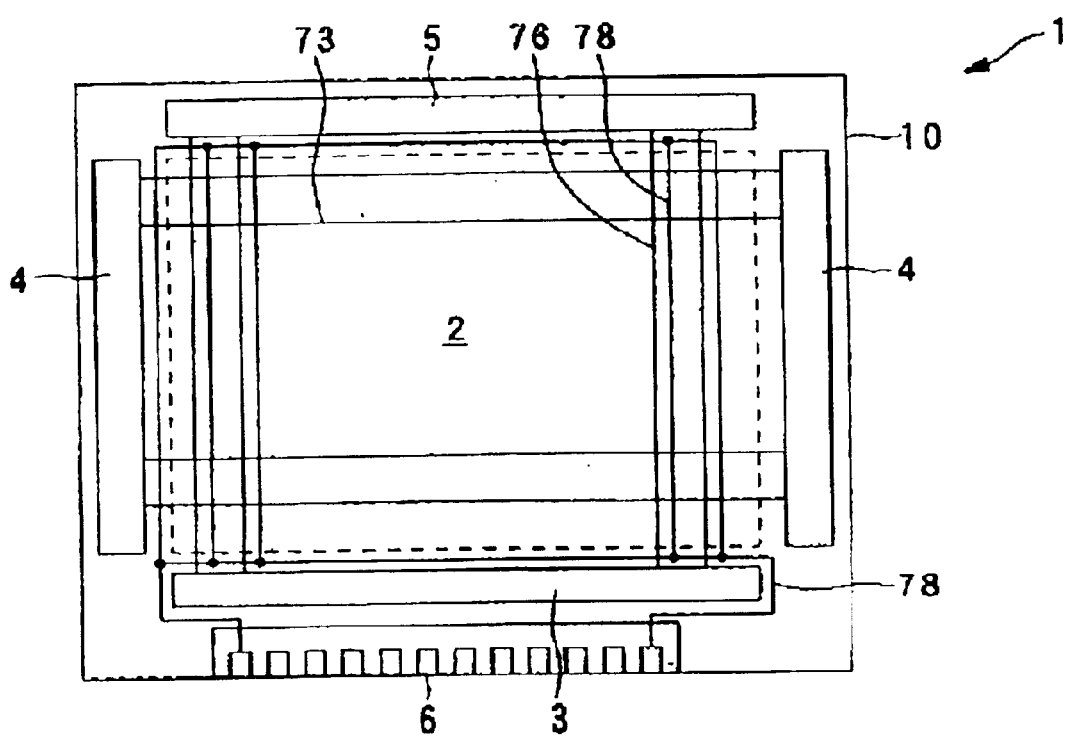
FIG. 1 is a schematic plan view showing the overall layout of a display device according to an embodiment of the present invention.
Figure 2:
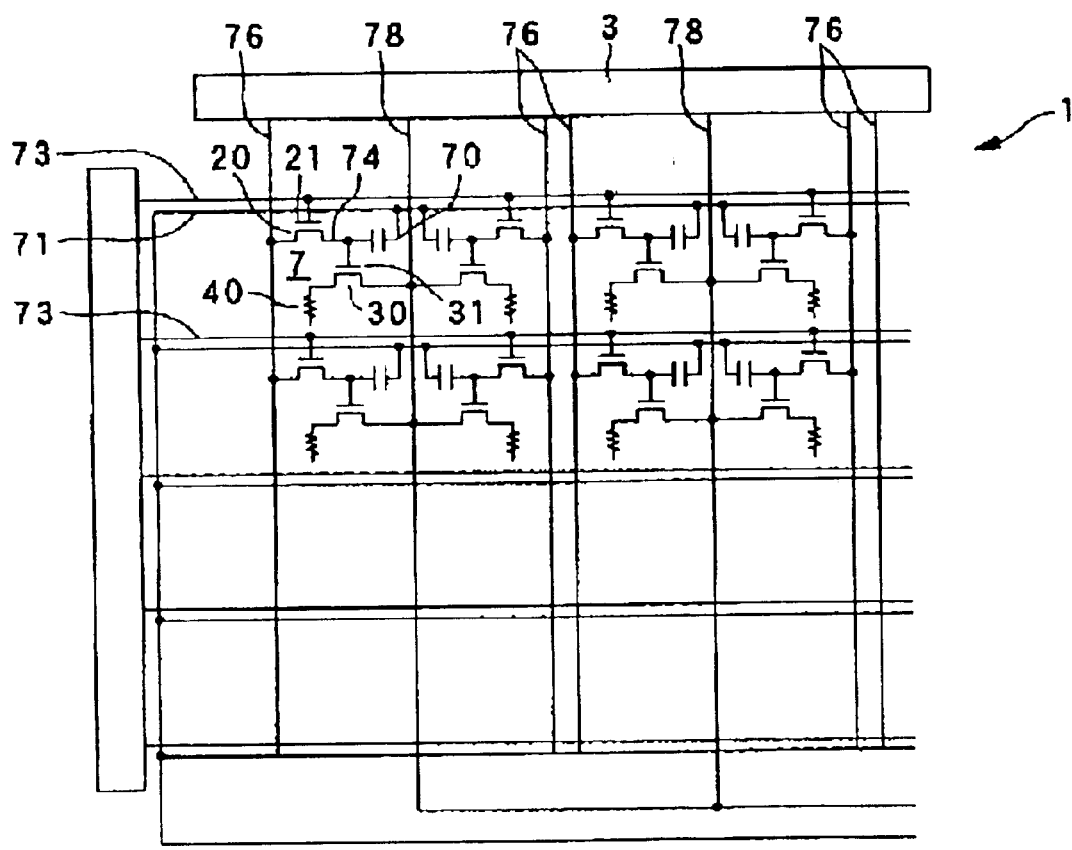
FIG. 2 is a schematic showing various elements in a plurality of pixels and equivalent circuits including wires formed in a matrix to define an image-displaying section of the display device of the embodiment, and showing driving circuits.

FIG. 1 is a schematic plan view showing the overall layout of a display device according to an embodiment of the present invention, and FIG. 2 is a schematic showing the structure of various elements and equivalent circuits in a plurality of pixels formed in a matrix to define an image-displaying section of the display device and showing driving circuits.

A display device 1 has a light-transmitting, transparent substrate 10, which is the base thereof, and an image-displaying section 2 on the cent area of the transparent substrate 10, as shown in FIG. 1. In the peripheral area of the image-displaying section 2 on the transparent substrate 10, a data line driving circuit 3 to output image signals and a check circuit 5 are disposed at the two ends of data lines 76. In the peripheral area, scanning line driving circuits 4 to output scanning signals are disposed at the two ends of scanning lines 73. The data line driving circuit 3 and the scanning line driving circuits 4 have many complementary TFTs, each including an N-type TFT and a P-type TFT. The complementary TFTs form shift registers, level shifters, analog switches, and the like. A mounting pad 6 including terminals to input image signals, various potentials, and pulsed signals, is disposed on the transparent substrate 10 in an area away from the data line driving circuit 3 towards the outside.

In the display device 1 having the above-described structure, the plurality of scanning lines 73 and the plurality of data lines 76 intersecting the scanning lines 73 are provided on the transparent substrate 10, and a plurality of pixels are arrayed in a matrix at each intersection of the data lines 76 and the scanning lines 73.

Also, common power lines 78 are provided beside the data lines 76 in parallel. By supplying a current to the common power lines 78, the organic EL elements emit light in the pixels.

As shown in FIG. 2, pixel regions 7 each have a first TFT 20. Scanning signals are supplied to a gate electrode 21 (first gate electrode) of the first TFT 20 through the corresponding scanning line 73. One of the source region and the drain region of the TFT 20 is electrically connected to a data line 76, and the other is electrically connected to a potential holding electrode 74. Capacitor lines 71 are provided beside the scanning lines 73 in parallel. Part of the capacitor lines 71 opposes the potential holding electrode 74 while being separated by a dielectric layer to define storage capacitors 70. Thus, when the first TFT 20 enters an on state according to a scanning signal, an image signal is written in the corresponding storage capacitor 70 from the corresponding data line 76 through the first TFT 20.

For the sake of convenience, the data line driving circuit 3 is illustrated above the image-displaying section 2 in FIG. 2, while it is illustrated below the image-displaying section 2 in FIG. 1.

The potential holding electrodes 74 are electrically connected to gate electrodes 31 (second gate electrodes) of second TFTs 30. One of the source region and the drain region of the second TFT 30 is electrically connected to the common power line 78, and the other is electrically connected to one electrode (pixel electrode described later) of a light-emitting element 40. The common power lines 78 are set at a constant potential. When the second TFT 30 enters an on state, a current flows from the corresponding common power line 78 to the corresponding light-emitting element 40 through the second TFT 30, so that the light-emitting element 40 emits light.

In this embodiment, pixel regions 7 are disposed at both sides of each common power line 78. The pixel regions 7 each have a light-emitting element 40 to which a driving current is supplied from the common power line 78. Two data lines 76 run at sides of the pixel regions 7 opposite to the common power line 78. Specifically, a unit is defined by: one data line 76, pixels connected to the data line 76, one common power line 78, pixels connected to the common power line 78, and another data line 76 that supplies image signals to the pixels. A plurality of units are disposed in the direction in which the scanning lines 73 extend. A single common power line 78 supplies a driving current to pixels arrayed in two columns. As a result, the areas where the common power lines 78 are formed are reduced and light-emitting areas can be increased in comparison with when one common power line 78 is provided for each column of pixels. Therefore, the performance of the display device, including the luminance and the contrast ratio, can be enhanced. Since a single common power line 78 is connected to pixels in two columns, two data lines 76 are placed beside each other in parallel, and each data line 76 supplies image signals to pixels in the corresponding column.

However, various arrangements of common power lines, capacitor lines, data lines, and the like may be made for use in the present invention. For example, the storage capacitors 70 may be formed with a conductive film formed by reducing the resistance of the semiconductive layer forming TFTs, and the common power lines 78 may be used as capacitor lines.

Pixel Structure

Figure 3:
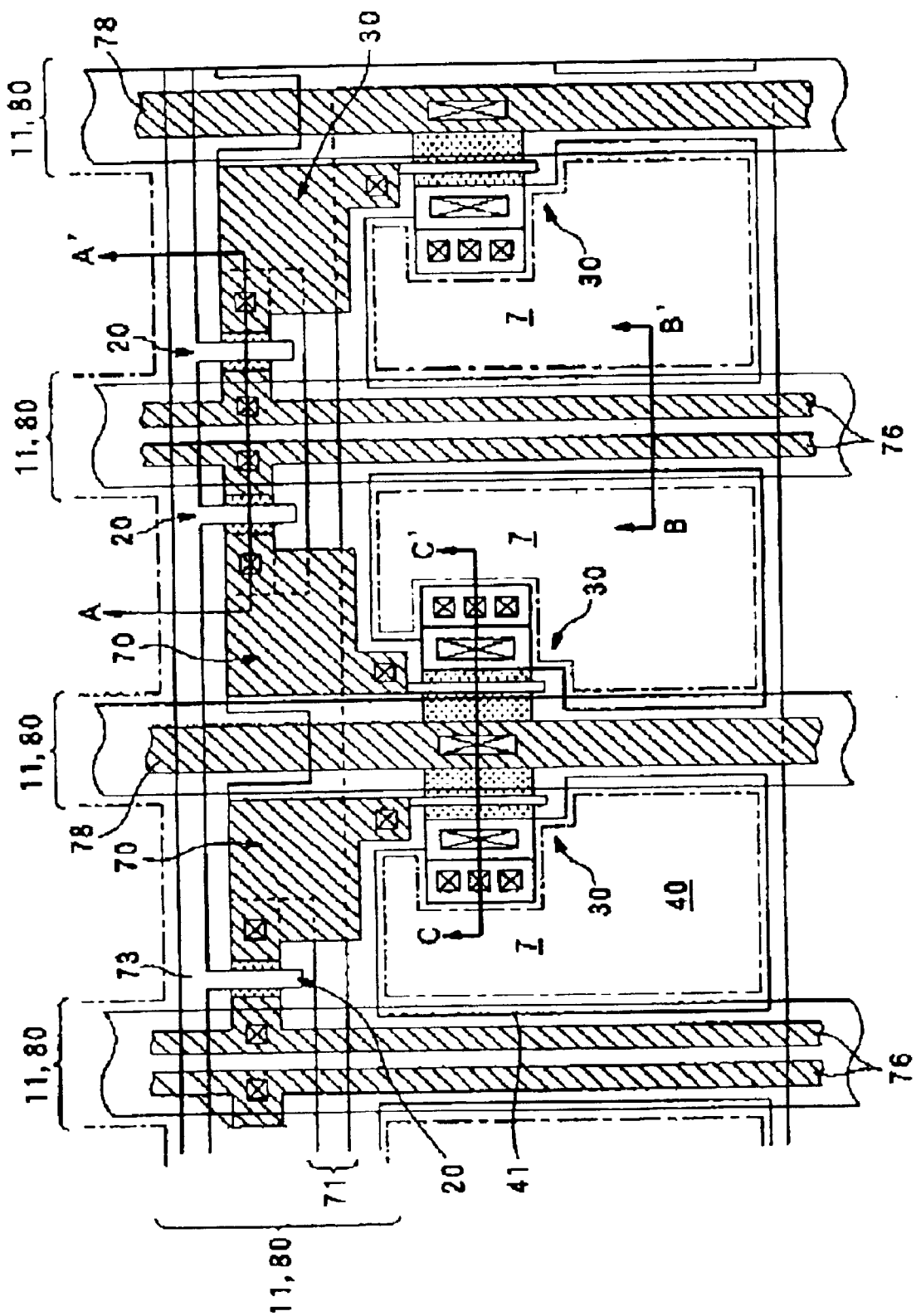
FIG. 3 is a fragmentary enlarged sectional view of pixel regions of the display device according to the embodiment of the invention.
Figure 4:
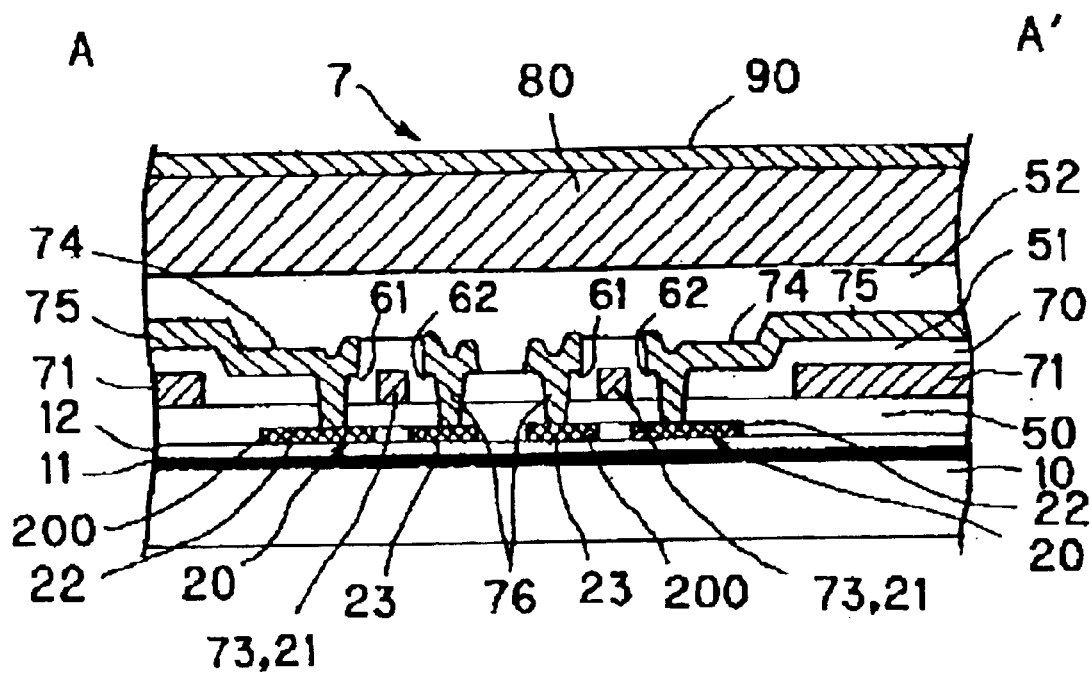
FIG. 4 is a sectional view taken along plane A–A' in FIG. 3.
Figure 5:
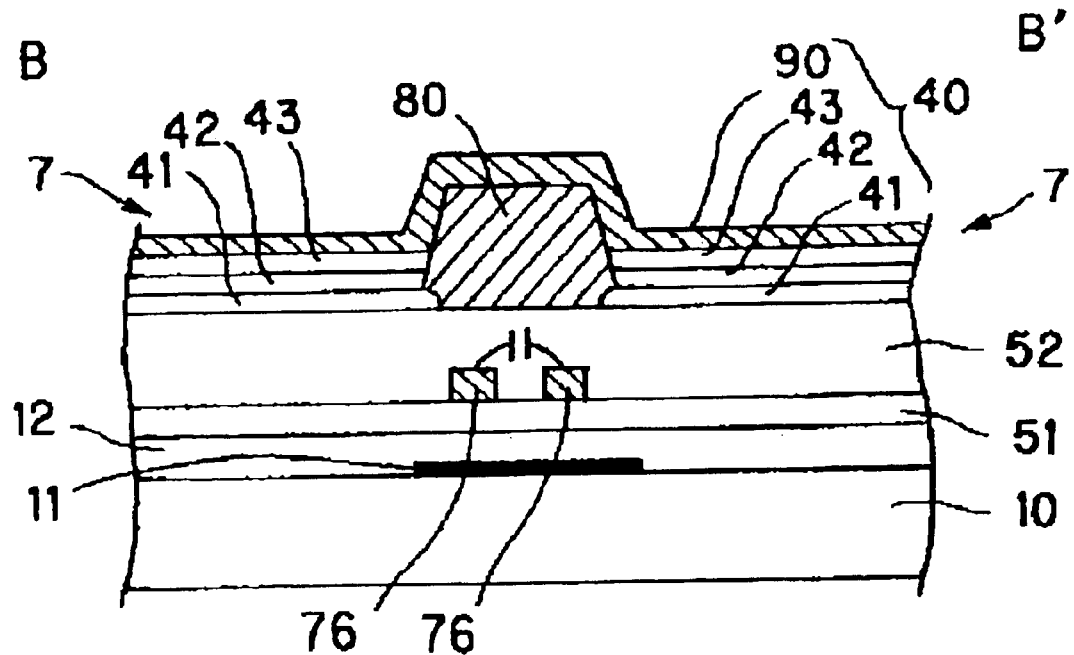
FIG. 5 is a sectional view taken along plane B–B' in FIG. 3.
Figure 6:
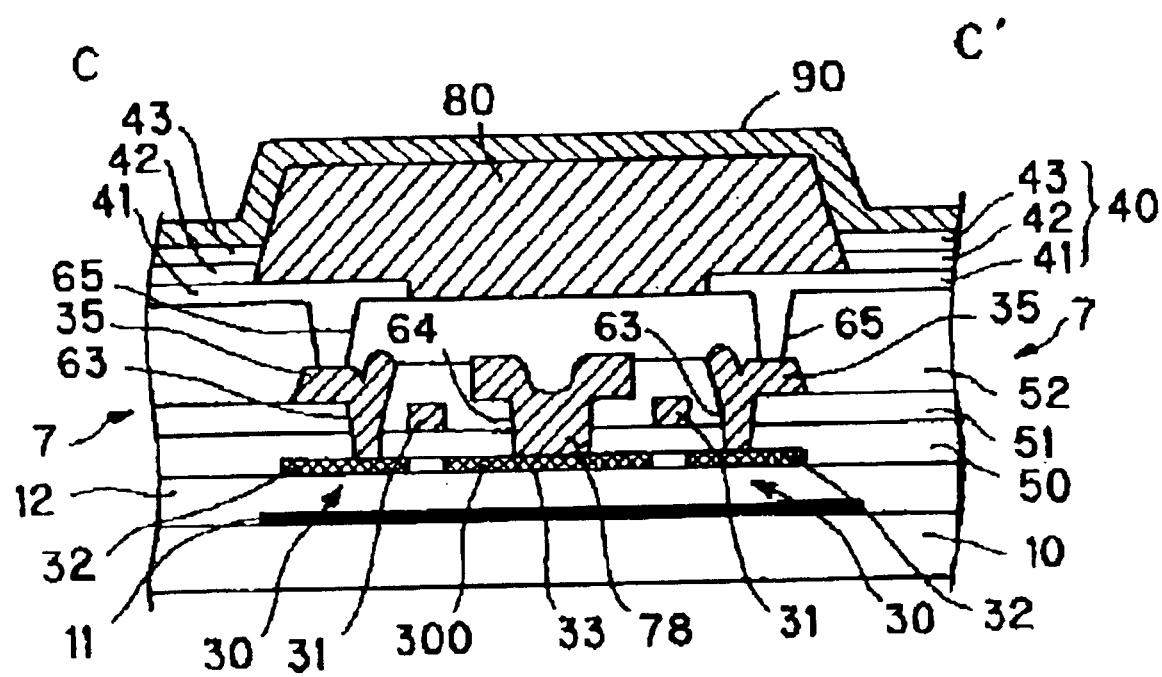
FIG. 6 is a sectional view taken along plane C–C' in FIG. 3.

The structure of the pixels in the image-displaying section 2 of the display device 1 of the embodiment will now be described with reference to FIGS. 3 to 6. FIG. 3 is a plan view of a plurality of pixels adjacent to each other on a transparent substrate. The pixels include the data lines, the scanning lines, the light-emitting elements, the TFTs, and the like. FIG. 4 is a sectional view taken along plane A–A' in FIG. 3, FIG. 5 is a sectional view taken along plane B–B' in FIG. 3, and FIG. 6 is a sectional view taken along plane C–C' in FIG. 3. In FIGS. 4 to 6, each layer and parts is illustrated at a different scale in order to be recognized in the drawing.

In the position corresponding to plane A–A' in FIG. 3, as shown in FIG. 4, an island-shaped silicon layer 200, to form first TFTs 20 in pixel regions 7, is disposed on a lower light-shielding layer 11 and an insulating underlayer 12, which will be described below, overlying the transparent substrate 10. The silicon layer 200 is provided with a gate insulating layer 50 on the surface thereof. Also, gate electrodes 21 are formed on the surface of the gate insulating layer 50. Each gate electrode 21 has a drain region 22 and a source region 23 which are implanted with a high concentration of dopant by self-aligning. The source regions and drain regions may change places with each other in the TFTs of the embodiment, but, in FIG. 4, the external sides of source/drain regions serve as the drain regions 22 and the internal sides of the source/drain regions serve as the source regions 23. A first insulating interlayer 51 is formed on the surface of the gate insulating layer 50. The drain regions 22 and the source regions 23 are electrically connected to the potential holding electrodes 74 and the data lines 76 through contact holes 61 and 62 formed in the insulating interlayer 51.

In each of the pixel regions 7, the interface (between the gate insulating layer 50 and the first insulating interlayer 51), where the scanning lines 73 and the gate electrodes 21 are disposed, has capacitor lines 71 placed in parallel with the scanning lines 73. The capacitor lines 71 underlie the extensions 75 of the potential holding electrodes 74 separated by the first insulating interlayer 51. Thus, capacitor lines 71 and the extensions 75 of the potential holding electrodes 74 define storage capacitors 70 in which the first insulating interlayer 51 serves as a dielectric layer. The surfaces of the potential holding electrodes 74 and data lines 76 are provided with a second insulating interlayer 52 thereon.

In the position corresponding to plane B–B' in FIG. 3, as shown in FIG. 5, two data lines 76 for the corresponding pixel regions 7 are placed beside each other in parallel on the surfaces of the first insulating interlayer 51 and the second insulating interlayer 52 formed on the lower light-shielding layer 11 and the insulating underlayer 12, which will be described below, overlying the transparent substrate 10.

In the position corresponding to plane C–C' in FIG. 3, as shown in FIG. 6, an island-shaped silicon layer 300 forming second TFTs 30 is disposed across two pixel regions 7 separated by a common power line 78, on the lower light-shielding layer 11 and the insulating underlayer 12, which will be described below, overlying the transparent substrate 10. The silicon layer 300 is provided with the gate insulating layer 50 on the surface thereof. Also, gate electrodes 31 are formed in the pixel regions 7 on the surface of the gate insulating layer 50 so as to have a common power line 78 therebetween. The gate electrodes 31 each have a drain region 32 and a source region 33 formed by self-aligning by being implanted with a high concentration of dopant. The first insulating interlayer 51 is formed on the surface of the gate insulating layer 50. The drain regions 32 are electrically connected to junction electrodes 35 through the contact holes 63 formed in the insulating interlayer 51. On the other hand, the region, defining a common source region 33 for two pixel regions 7 in the center of the silicon layer 300, is connected to the common power line 78 through a contact hole 64 in the first insulating interlayer 51. The surfaces of the common power line 78 and the junction electrodes 35 are provided with the second insulating interlayer 52 thereon. Pixel electrodes 41 are formed of an ITO film on the surface of the second insulating interlayer 52. The pixel electrodes 41 are electrically connected to the junction electrodes 35 through contact holes 65 formed in the second insulating interlayer 52, and are further electrically connected to the drain regions 32 of the second TFTs 30 through the junction electrodes 35.

The pixel electrodes 41 each serve as one electrode of a light-emitting element 40. Specifically, a hole injection layer 42 and an organic semiconductive layer 43 are deposited on the surfaces of the pixel electrodes 41. The organic semiconductive layer 43 is provided thereon, with an opposing electrode 90 formed of a metallic film, such as aluminum containing lithium or calcium. The opposing electrode 90 is a common electrode opposing at least the entire surfaces of the pixel electrodes 41, or formed in a striped manner, and is set at a constant potential.

In the light-emitting elements 40 having the above-described structure, voltage is applied to the opposing electrode 90 and each pixel electrode 41 so that they serve as an anode and a cathode, respectively. As the applied voltage rises above a threshold, the current (driving current) flowing to the organic semiconductive layer 43 is rapidly increased. As a result, the corresponding light-emitting element 40 emits light serving as an electrolight-emitting element or an LED element. The light from the light-emitting element 40 is reflected at the opposing electrode 90 to pass through the transparent pixel electrode 41 and the transparent substrate 10, and thus the light is radiated.

This driving current to emit light flows through a current path including the opposing electrode 90, the organic semiconductive layer 43, the hole injection layer 42, the pixel electrode 41, the second TFT 30, and the common power line 78. When the second TFT 30 is in an off state, therefore, current does not flow. In the display device 1 of the embodiment, however, when a first TFT 20 enters an on state according to a scanning signal, an image signal is written in the corresponding storage capacitor 70 from the corresponding data line 76 through the first TFT 20. Hence, the storage capacitor 70 allows the gate electrode of the second TFT 30 to maintain a constant potential corresponding to the image signal even when the first TFT 20 is in an off state, and thus the second TFT 30 remains in the on state. The driving current, therefore, keeps flowing to the light-emitting element 40 and the corresponding pixel continues to emit light. This state is maintained until a new image data is written in the storage capacitor 70 and the second TFT 30 enters an off state.

The driving current flowing through the common power lines 78 is larger than the current flowing through the data lines 76 because the current is used to drive the light-emitting elements 40. Preferably, the resistance per unit length of the common power lines 78 is smaller than that of the data lines 76. For example, if the common power lines 78 and the data lines 76 are formed of the same material, the width and thickness of the former is preferably larger than the width and thickness of the latter.

As shown in FIGS. 3 to 6, particularly in the embodiment, the conductive lower light-shielding layer 11 is disposed on the transparent substrate 10 to shield the TFTs 20 and 30, which are exemplary driving elements, from light from the underside of the transparent substrate 10. The lower light-shielding layer 11 is formed by depositing an elemental metal, an alloy, a metal silicide, or polysilicide containing at least one high-melting point metal, such as Ti (titanium), Cr (chromium), W (tungsten), Ta (tantalum), Mo (molybdenum), and Pb (lead). The lower light-shielding layer 11, acting as a mask, is subjected to light exposure from the rear surface of the transparent substrate 10 as in a method to be described below, and thus the bank layer 80 is formed by self-aligning above the lower light-shielding layer 11 on the transparent substrate 10. Hence, the lower light-shielding layer 11 and the bank layer 80 have substantially the same shape in plan view.

The insulating underlayer 12 is formed on the lower light-shielding layer 11, and the semiconductive layers 200 and 300 which form the TFTs 20 and 30, respectively, are formed on the insulating underlayer 12. Besides insulating the TFTs 20 and 30 from the lower light-shielding layer 1, the insulating underlayer 12 covering the entire transparent substrate 10 protects the transparent substrate 10 from roughness caused by grinding and contamination after cleaning. Thus, the insulating underlayer 12 prevents the characteristics of the TFTs 20 and 30 from deteriorating.

Since, according to the embodiment, the lower light-shielding layer 11 and the bank layer 80 have substantially the same shape in plan view, as shown in FIG. 3, the aperture ratio in pixels is hardly reduced due to the alignment accuracy between the lower light-shielding layer 11 and the bank layer 80, as in the related art discussed above. Also, the variation of the aperture ratio in pixels is reduced.

In addition, since the lower light-shielding layer 11 on the transparent substrate 10 covers the channel regions of the TFTs 20 and 30 from the underside thereof, in the embodiment, the occurrence of optical leakage current in the TFTs 20 and 30 is reduced. Thus, TFTs 20 and 30 having excellent characteristics drive the light-emitting elements 40.

In the embodiment, not only the areas where the TFTs 20 and 30 are formed, but also the area where the data lines 76, the common power lines 78, the scanning lines 73, the capacitor lines 71, and the like are formed, have the lower light-shielding layer 11 and the bank layer 80 having substantially the same shape in plan view. The lower light-shielding layer 11 and the bank layer 80 define aperture regions of pixels, and prevent a driving current from flowing to light-emitting elements 40 which are not involved in displaying images to prevent the occurrence of unwanted current. In particular, the bank layer 80 is formed of a black resist, and the lower light-shielding layer 11 is formed of a light-shielding film, such as a high-melting point metallic film. The lower light-shielding layer 11 and the bank layer 80 having substantially the same shape in plan view, therefore, serve as a black matrix to enhance the contrast ratio of displayed images. The bank layer 80 may be formed of a resin, such as polyimide, and may be formed of two layers or more.

Preferably, in accordance with the invention, the lower light-shielding layer 11 is set at a fixed potential in the peripheral area. Thus, the change in potential of the lower light-shielding layer 1, which is located right under the TFTs 20 and 30 formed on the insulating underlayer 12, affects the TFTs 20 and 30 less adversely, irrespective of the thickness of the insulating underlayer 12.

However, for example, by forming the insulating underlayer 12 to a certain thickness, the conductive lower light-shielding layer 11 can be used as wires in the image-displaying section 2. Also, the conductive lower light-shielding layer 11 can be used as wires in at least the peripheral area (see FIG. 1).

Accordingly, the display device of the embodiment can display bright and high-quality images.

In the above-described embodiment, the lower light-shielding layer 11 and the bank layer 80 have the same shape in plan view. An upper light-shielding layer, however, may be formed above the transparent substrate 10 to cover the TFTs 20 and 30 at the upper side thereof, and the bank layer 80 may be formed by self-aligning with the upper light-shielding layer. This structure prevents light entering from the upper side from generating optical leakage current in TFTs 20 and 30, and has advantages in that the aperture ratio in the pixels does not decrease and that the variation of the aperture ratio decreases. Such a light-shielding layer may be disposed at both upper and under sides of thin-film transistors, and may be formed of, for example, the same material as that of the lower light-shielding layer 11, which contains a high-melting point metallic film.

Also, in addition to, or instead of, the lower light-shielding layer 11 or the upper light-shielding layer, or instead of part of these layers, the data lines 76 or the like, which are formed of light-shielding conductive film and are connected to the TFTs 20 and 30, may act as a mask when subjected to light exposure from the rear surface of the transparent substrate 10 to form the bank layer 80 by self-aligning. This structure, also, provides advantages in that the aperture ratio in the pixels does not decrease, and that the variation of the aperture ratio decreases.

The substrate does not need to be transparent, as long as it can transmit enough light to perform light exposure from the rear surface thereof.

Manufacturing Process

Figure 7:
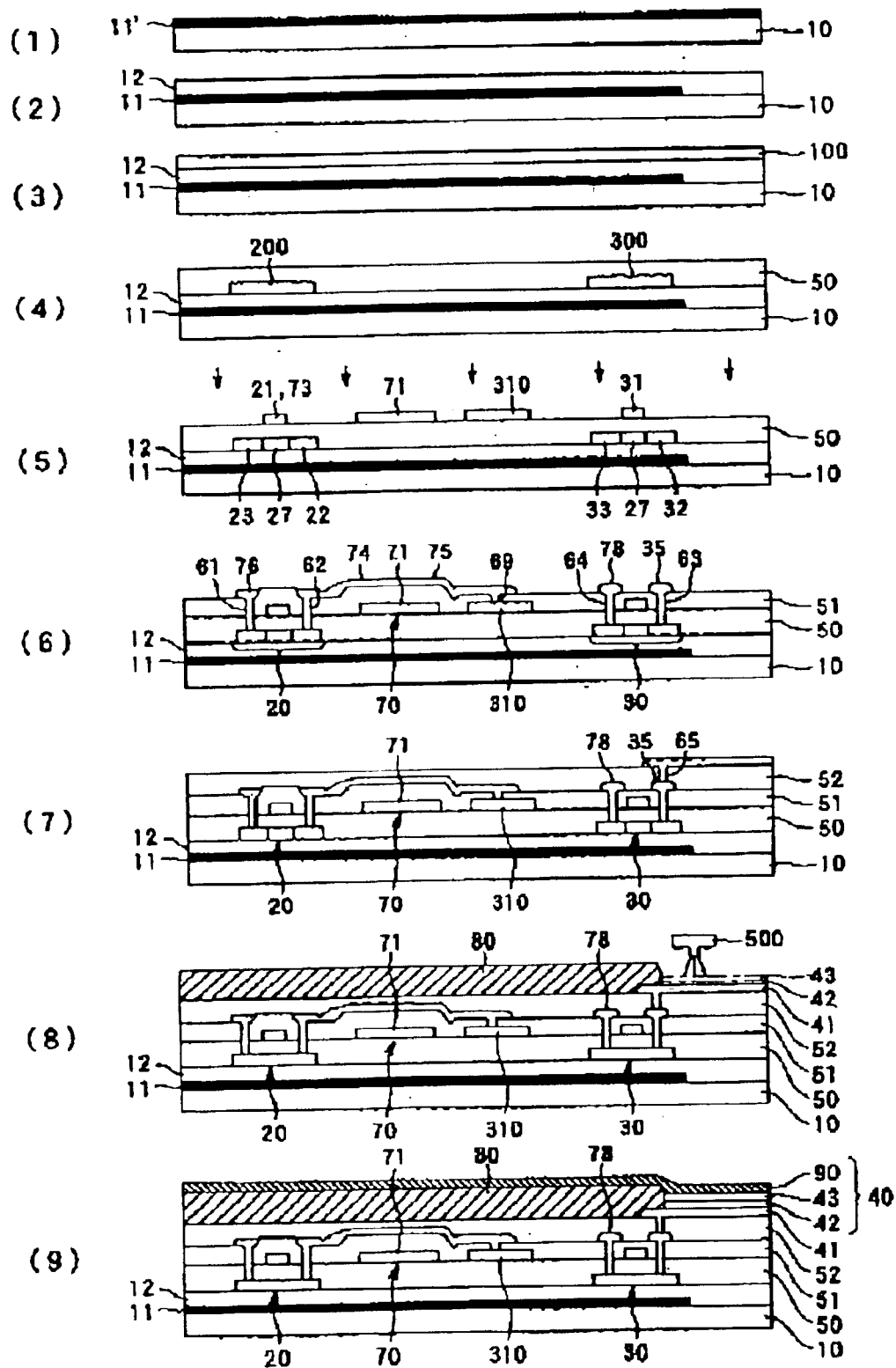
FIG. 7 is a schematic drawing sequentially illustrating the layered structure on a transparent substrate in each step of manufacturing the display device according to the embodiment of t he invention.

A manufacturing process of the embodiments will now be described with reference to FIG. 7. FIG. 7 is a schematic sequentially illustrating the layered structure including the TFTs 20 and 30, the capacitor line 71, an extension 310 of the gate electrode 31 in steps of manufacturing the display device according to the embodiment.

First, as shown in step (1) in FIG. 7, the transparent substrate 10, such as a quartz substrate or a hard glass substrate, is prepared. Preferably, the transparent substrate 10 is subjected to pretreatment by annealing in an inert gas such as $N_2$ (nitrogen) at a high temperature of about 900 to 1300° C. so that less distortion will occur in the transparent substrate 10 in a later high-temperature process.

Subsequently, a metal film, such as Ti, Cr, W, Ta, Mo, and Pb, or an alloy film, such as metal silicide, is deposited by sputtering on the entire surface of the transparent substrate 10 processed in the above-described step to form a light-shielding layer 11' with a thickness of about 100 to 500 nm, preferably about 200 nm.

Next, as shown in step (2), the lower light-shielding layer 11 having the same grid shape as that of the bank layer 80 in plan view is formed by photolithography and etching. Subsequently, the insulating underlayer 12 including a silicate glass film, such as NSG, PSG, BSG, or BPSG, a silicon nitride film, a silicon oxide film, or the like is deposited using TEOS (tetraethyl orthosilicate) gas, TEB (tetraethyl botrate) gas, or TMOP (tetramethyl oxyphosrate) gas by CVD under normal or reduced pressure. The thickness of the insulating underlayer 12 is, for example, in the range of about 200 to 2000 nm.

Next, as shown in step (3), the substrate is set at a temperature of about 350° C., and an amorphous silicon film is deposited to a thickness of about 30 to 70 nm on the surface of the insulating underlayer 12 by plasma CVD to form a semiconductive layer 100. Then, the semiconductive layer 100, formed of the amorphous silicon film, is crystallized by laser annealing, solid phase deposition, or the like to form a polysilicon layer. In the case of laser annealing, for example, a linear beam having a beam length of 400 mm from an excimer laser is used, and the output intensity of the beam is, for example, 200 mJ/cm². The line beam scans the layer, such that a part of the beam having an intensity of 90% of the peak intensity in the short length direction overlaps each region.

Next, as shown in step (4), the semiconductive layer 100 is patterned to form island-shaped semiconductive layers 200 and 300. The surfaces of the semiconductive layers 200 and 300 are subjected to plasma CVD using TEOS, oxygen gas, or the like as a material gas to form the gate insulating layer 50 with a thickness of about 60 to 150 nm including a silicon oxide film or a silicon nitride film.

Next, as shown in step (5), a conductive layer is formed, by sputtering, of a metallic film, such as aluminum, tantalum, molybdenum, titanium, or tungsten, and is subsequently patterned to form the gate electrodes 21 and 31. In this step, the scanning lines 73 and the capacitor lines 71 are also formed. The reference numeral 310 in the drawing designates the extension of a gate electrode 31.

In this state, a high concentration of phosphorous ions is implanted to form drain regions 22 and source regions 23 for the gate electrodes 21 in the silicon thin layer 200, and to form drain regions 32 and source regions 33 for the gate electrodes 31 in the silicon thin layer 300 by self-aligning. The region which is not implanted with the dopant is formed into the channel regions 27 and 37.

Next, as shown in step (6), after the first insulating interlayer 51 is formed, contact holes 61, 62, 63, 64, and 69 are formed by dry etching, wet etching, or a combination of dry etching and wet etching to form the data line 76, the capacitor line 71, the potential holding electrode 74 having an extension 75 overlying the extension 310 of the gate electrode 31, the common power line 78, and the junction electrode 35. As a result, the potential holding electrode 74 is electrically connected to the gate electrode 31 through the contact hole 69 and the extension 310. Thus, the first TFT 20 and the second TFT 30 are formed. Also, the storage capacitor 70 is formed with the capacitor line 71 and the extension 75 of the potential holding electrode 74.

Next, as shown in step (7), the second insulating interlayer 52 is formed, and a contact hole 65 is formed in the area of the insulating interlayer corresponding to the junction electrode 35. An ITO (indium tin oxide) layer is deposited on the entire surface of the second insulating interlayer 52, and is then patterned to form the pixel electrode 41 electrically connected to the drain region 32 of the second TFT 30 through the contact hole 65.

Next, as shown in step (8), a black resist layer is formed on the surface of the second insulating interlayer 52, and is removed at areas other than the area where the hole injection layer 42 and the organic semiconductive layer 43 of the light-emitting element 40 will be formed to define a light-emitting region. Then, it is subjected to photolithography and etching to form the bank layer 80.

In particular, no dedicated photomask is used to form the bank layer 80 in the embodiment. The lower light-shielding layer 1, which is previously provided in step (2) in the area where the bank layer 80 will be formed, is used as a photomask, and is subjected to light exposure from the rear surface of the transparent substrate 10 to form the bank layer 80 by self-aligning.

Subsequently, a liquid material (precursor) to form the hole injection layer 42 is discharge-d into the internal area of the bank layer 80 from an ink-jet head 500 to form the hole injection layer 42 in the internal area of the bank layer 80. In the same manner, a liquid material (precursor) to form the organic semiconductive layer 43 is discharge-d into the internal area of the bank layer 80 from the ink-jet head 500 to form the organic semiconductive layer 43 in the internal area of the bank layer 80. The bank layer 80 is water-repellent because it is formed of a resist. In contrast, the precursor of the organic semiconductive layer 43 uses a hydrophilic solvent. The bank layer 80, therefore, securely defines the area where the organic semiconductive layer 43 is applied, and the organic semiconductive layer 43 does not overflow into the adjacent pixels. Thus, the organic semiconductive layer 43 and the like are only formed in predetermined areas. However, when the bank layer 80, serving as a separation wall, has a height of about 1 µm, the bank layer 80 does not need to be water-repellent and sufficiently functions as a separation wall. Also, by forming the bank layer 80, the areas where the hole injection layer 42 and the organic semiconductive layer 43 are formed can be defined even if these layers are formed by applying materials instead of the ink-jet method.

Next, as shown in step (9), the opposing electrode 90 is formed on the entire surface of the transparent substrate 10 or in a striped manner.

As described above, according to the method of the embodiment, the lower light-shielding layer 11 patterned in step (2) is used as a mask and is subjected to light exposure from the rear surface of the transparent substrate 10 in step (8). Thus, the bank layer 80 is formed by self-aligning. Thus, after the device is completed, the lower light-shielding layer 11 and the bank layer 80 have substantially the same shape in plan view. Therefore, an active matrix-driving display device capable of displaying bright and high-quality images, and having an increased aperture ratio in pixels and a reduced variation of the aperture ratio can be manufactured at a relatively low cost.

On the other hand, the data line driving circuit 3 and the scanning line driving circuits 4 shown in FIG. 1 also have TFTs. These TFTs are formed using the entirety or part of the step of forming TFTs in the pixel regions 7. Thus, the TFTs defining the driving circuits are also formed in the same interlayer as the TFTs in the pixel regions 7.

Both of the above-described TFTs 20 and 30 may be N-type or P-type, or one of them may be N-type and the other may be P-type. Even though any combination of TFTs can be used, the TFTs can be formed by known methods, and thus the description thereof is omitted.

The hole injection layer 42 may be eliminated from the light-emitting element 40 though the luminous efficiency (the ratio of hole injection) decreases slightly. An electron injection layer may be formed on the organic semiconductive layer 43 opposite to the hole injection layer 42 instead of the hole injection layer 42, or both of the hole injection layer 42 and the electron injection layer may be formed.

When, in particular, the bank layer 80 is formed by self-aligning with an upper light-shielding layer or light-shielding wires instead of the lower light-shielding layer 11, the upper light-shielding layer is formed in advance in the area where the bank layer 80 will be formed, and then acts as a mask while being subjected to light exposure from the rear surface of the transparent substrate 10 to form the bank layer 80 by self-aligning in step (8) in FIG. 7.

The above-described display device can be used for electronic apparatuses, such as mobile personal computers, cellular phones, and digital still cameras.

Figure 8:
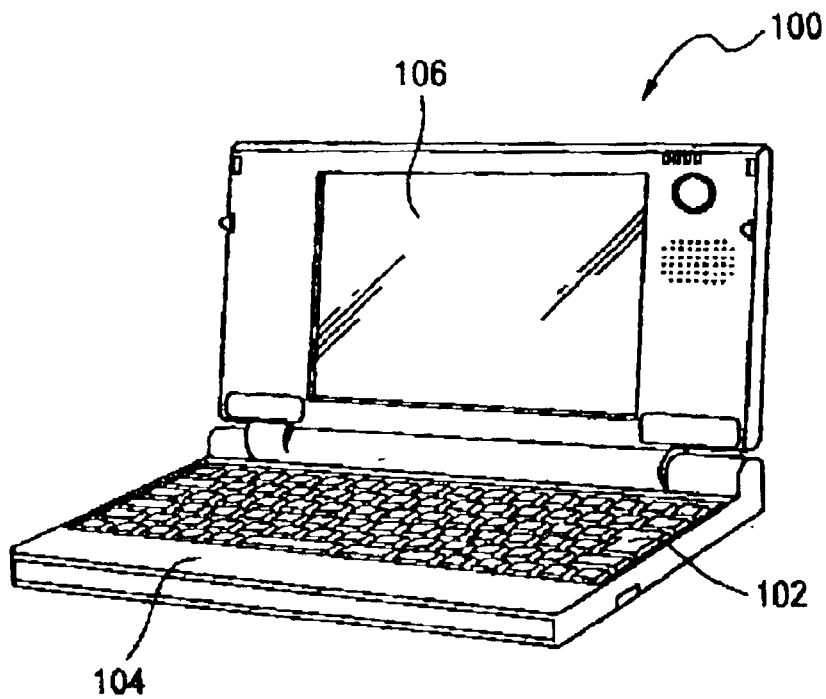
FIG. 8 is a perspective view showing the structure of a personal computer as an example of an electronic apparatus using the display device according to an embodiment of the invention.

FIG. 8 is a perspective view showing the structure of a mobile personal computer.

In FIG. 8, a personal computer 100 includes a body 104 including a keyboard 102 and a display unit 106 using the above-described display device.

Figure 9:
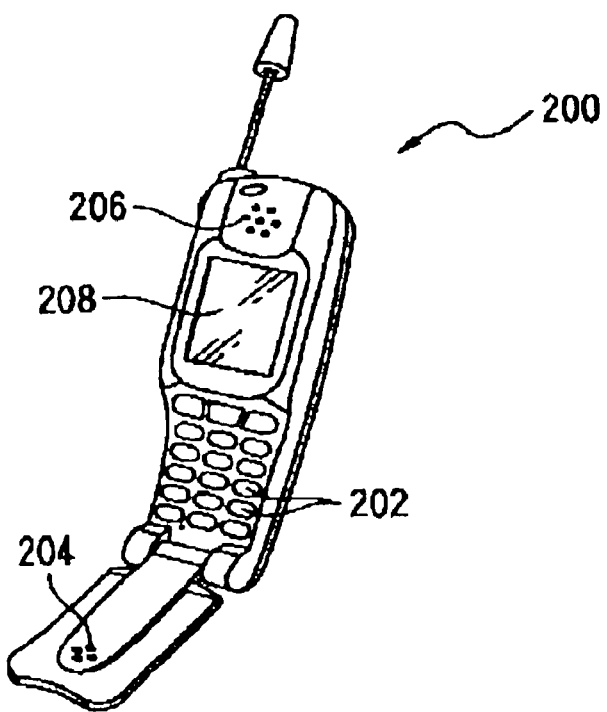
FIG. 9 is a perspective view showing the structure of a cellular phone as an example of an electronic apparatus using the display device according to an embodiment of the invention.

FIG. 9 is a perspective view of a cellular phone. In FIG. 9, a cellular phone 200 includes a plurality of operation buttons 202, an earpiece 204, a mouthpiece 206, and the above-described display device 208.

Besides the personal computer shown in FIG. 8 and the cellular phone shown in FIG. 9, exemplary electronic apparatuses using the above-described display device as a display section or the like include, for example, digital cameras, TV sets, viewfinder-type and monitor-direct-view-type videotape recorders, car navigation systems, pagers, electronic notebooks, calculators, word processors, workstations, video phones, POS terminals, and apparatuses having touch panels.

The present invention is not limited to the embodiments described above. Various modifications may be made within the scope and spirit of the invention, as described in and by the claims and the specification. Also, manufacturing methods for display devices and display devices in which such modifications are made are included in the scope of the technology of the present invention.

What is claimed is:

1. A method for manufacturing a display device that includes a light-transmitting substrate, a plurality of light-emitting elements arrayed in a plane above the light-transmitting substrate, driving elements connected to the light-emitting elements, a bank layer disposed in boundary areas between the plurality of light-emitting elements, and wires connected to the driving elements, the method comprising:

forming the wires on the light-transmitting substrate by patterning a light-shielding, conductive layer so as to have a shape in plan view corresponding to the shape of the bank layer in plan view;

forming the bank layer by self-aligning above the wires on the substrate by exposing the wires, acting as a mask, from the rear surface of the substrate; and forming the light-emitting elements in the areas surrounded by the bank layer.

2. The method for manufacturing a display device according to claim 1, further comprising the step of forming the driving elements in the boundary areas between the steps of forming the wires and forming the bank layer.

3. A method for manufacturing a display device that includes a light-transmitting substrate, a plurality of light-emitting elements arrayed in a plane above the light-transmitting substrate, driving elements connected to the light-emitting elements, a bank layer disposed in the boundary areas between the plurality of light-emitting elements, and a light-shielding layer to shield at least part of the driving elements from light, the method comprising:

forming the light-shielding layer on the light-transmitting substrate by pattering a shape in plan view corresponding to the shape of the bank layer in plan view;

forming the bank layer by self-aligning above the light-shielding layer on the substrate by exposing the light-shielding layer, acting as a mask, from a rear surface of the substrate; and forming the light-emitting elements in the areas surrounded by the bank layer.

4. The method for manufacturing a display device according to claim 3, further comprising the step of forming the driving elements in the boundary areas between the steps of forming the light-shielding layer and forming the bank layer.

5. The method for manufacturing a display device according to claim 3, further including forming the driving elements of thin-film transistors, and patterning the light-shielding layer so as to cover at least channel regions of the thin-film transistors at the light-transmitting substrate side of the thin-film transistors in the step of forming the light-shielding layer.

6. The method for manufacturing a display device according to claim 3, the step of forming the light-shielding layer including forming a conductive light-shielding layer serving as wires.

7. The method for manufacturing a display device according to claim 1, the step of forming the light-emitting elements including a sub step of using an ink-jet method to form at least part of the light-emitting elements.

8. The method for manufacturing a display device according to claim 1, the step of forming the light-emitting elements including a sub step of forming an organic electrolight-emitting layer or an organic semiconductive layer.

9. A display device, comprising:

a light-transmitting substrate;

a plurality of light-emitting elements arrayed in a plane above the light-transmitting substrate;

driving elements, each connected to the corresponding light-emitting element;

a bank layer disposed in boundary areas between the plurality of light-emitting elements; and wires formed of a light-shielding, conductive film, connected to the driving elements above the substrate, the wires above the substrate act as a mask while being subjected to light exposure from a rear surface of the substrate to form the bank layer above the wires by self-aligning.

10. A display device, comprising:

a light-transmitting substrate;

a plurality of light-emitting elements arrayed in a plane above the light-transmitting substrate;

driving elements, each connected to the corresponding light-emitting element;

a bank layer disposed in boundary areas between the plurality of light-emitting elements; and wires formed of a light-shielding, conductive film, connected to the driving elements, at least part of the wires having a shape in plan view corresponding to the shape of the bank layer in plan view.

11. The display device according to claim 9, the wires including at least one selected from data lines, scanning lines, capacitor lines, and common power lines.

12. A display device, comprising:

a light-transmitting substrate;

a plurality of light-emitting elements arrayed in a plane above the light-transmitting substrate;

driving elements, each connected to the corresponding light-emitting element;

a bank layer disposed in boundary areas between the plurality of light-emitting elements; and a light shielding layer to shield at least part of the driving elements from light, the light-shielding layer being above the substrate and acting as a mask while being subjected to light exposure from a rear surface of the substrate to form the bank layer above the light-shielding layer by self-aligning.

13. A display device, comprising:

a light-transmitting substrate;

a plurality of light-emitting elements arrayed in a plane above the light-transmitting substrate;

driving elements, each connected to the corresponding light-emitting element;

a bank layer disposed in boundary areas between the plurality of light-emitting elements; and a light-shielding layer to shield at least part of the driving elements from light, the light-shielding layer having a shape in plan view corresponding to the shape of the bank layer in plan view.

14. The display device according to claim 12, the driving elements each including a thin-film transistor, and the light-shielding layer covering at least the channel region of the transistor from the underside of the transistor.

15. The display device according to claim 12, the driving elements each including a thin-film transistor, and the light-shielding layer covering at least the channel region of the thin-film transistor from the upper side of the thin-film transistor.

16. The display device according to claim 9, the light-emitting element including at least one of an organic electrolight-emitting layer and an organic semiconductive layer.

17. The display device according to claim 9, the driving elements including a plurality of thin-film transistors for each light-emitting element.

18. The display device according to claim 9, further comprising a peripheral circuit, in the peripheral region on the substrate, connected to the driving elements or the wires, part of the wires of the peripheral circuit being formed with the same layer as the wires or the light-shielding layer.

19. An electronic apparatus, comprising:

the display device as set forth in claim 9.

* * * * *